(12) United States Patent
Ki et al.

(10) Patent No.: US 8,294,866 B2
(45) Date of Patent: Oct. 23, 2012

(54) LIQUID CRYSTAL DISPLAY DEVICE AND METHOD OF MANUFACTURING THE SAME

(75) Inventors: Dong-Hyeon Ki, Cheonan-si (KR);
Mee-Hye Jung, Suwon-si (KR);
Se-Hyoung Cho, Seoul (KR);
Dong-Gyu Kim, Yongin-si (KR);
Seung-Soo Baek, Suwon-si (KR);
Hye-Seok Na, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 242 days.

(21) Appl. No.: 12/885,010

(22) Filed: Sep. 17, 2010

(65) Prior Publication Data
US 2011/0096280 A1 Apr. 28, 2011

(30) Foreign Application Priority Data
Oct. 27, 2009 (KR) ........................ 10-2009-0102474

(51) Int. Cl.
*G02F 1/1343* (2006.01)
(52) U.S. Cl. ........................... 349/144; 349/48; 349/146
(58) Field of Classification Search .................... 349/48, 349/144
See application file for complete search history.

(56) References Cited

U.S. PATENT DOCUMENTS
2010/0053490 A1* 3/2010 Kang et al. ...................... 349/48

FOREIGN PATENT DOCUMENTS
| KR | 1020080025498 | 3/2008 |
| KR | 1020090024031 | 3/2009 |
| KR | 1020090130610 | 12/2009 |
| KR | 1020100124618 | 11/2010 |

* cited by examiner

*Primary Examiner* — Richard Kim
(74) *Attorney, Agent, or Firm* — F. Chau & Associates, LLC

(57) ABSTRACT

Disclosed are a liquid crystal display device and a method of manufacturing the liquid crystal display device. The liquid crystal display device includes a first insulating substrate, a gate line and a data line formed on the first insulating substrate and crossing each other, a first pixel electrode formed on the first insulating substrate and including a first part and a second part which are physically separated, a second pixel electrode formed on the first insulating substrate and forming an electric field with the first pixel electrode, a connection bridge including at least one conductive layer and electrically connecting the first part with the second part through a contact hole, and at least one insulating layer positioned between the first pixel electrode and the connection bridge, wherein the contact hole is formed in the at least one insulating layer.

19 Claims, 15 Drawing Sheets

LIQUID CRYSTAL DISPLAY DEVICE AND METHOD OF MANUFACTURING THE SAME

CROSS-REFERENCE TO RELATED APPLICATION

This application claims priority under 35 U.S.C. §119 to Korean Patent Application No. 10-2009-0102474, filed on Oct. 27, 2009 in the Korean Intellectual Property Office (KIPO), the contents of which are herein incorporated by reference in their entirety.

BACKGROUND OF THE INVENTION (a) Technical Field

The present invention relates to a liquid crystal display and method of manufacturing the liquid crystal display, and more particularly, to a liquid crystal display, which has high transmittance and image defect free characteristics, and a method of manufacturing the liquid crystal display.

(b) Discussion of the Related Art

Transmittance defined as a ratio of the maximum intensity of transmitted light to intensity of light that is incident on a liquid crystal panel is one important characteristic of a liquid crystal panel because it has a definitive effect on power consumption and brightness of a final product. Transmittance may vary with a variety of parameters, such as color filter properties, kind of liquid crystal driving mode, aperture ratio of a thin film transistor substrate, and so forth. Korean Patent Application Publication No. 10-2009-0024031, which is incorporated herein by reference, discloses an exemplary liquid crystal driving mode that has further improved transmittance in comparison with conventional liquid crystal driving modes. This liquid crystal driving mode features initial vertical alignment, horizontal electric field, and high voltage driving, and was developed to achieve fast response and wide viewing characteristics. It has become known that transmittance, when using this driving mode, is improved by about 10% in comparison with conventional liquid crystal driving modes provided that a response speed of the liquid crystal is set to levels associated with the conventional driving modes.

This new liquid crystal driving mode requires two data lines for each pixel, which, in turn, increases the number of data driver channels. Moreover, the liquid crystal driving mode may further increase the number of data lines required when combined with the structure for obtaining driving margin by simultaneously turning on two gate lines for high resolution fast driving, as disclosed in Korean Patent Application Publication No. 10-2008-0025498, which is incorporated herein by reference.

Korean Patent Application No. 10-2008-0056321, which is incorporated herein by reference, discloses introducing a common data line to substantially reduce the number of data lines required for one pixel to one. In Korean Patent Application No. 10-2008-0056321, two pixel electrodes of one pixel are capacitively coupled to different data lines, respectively.

Referring to FIG. 1, to overcome a lowering in image quality, the liquid crystal display according to Korean Patent Application No. 10-2009-0043720, which is incorporated herein by reference, is configured such that two pixel electrodes of one pixel are capacitively coupled to the neighboring two data lines to have the same capacitance.

Referring to FIG. 1, the first pixel electrode P1 is positioned near the second pixel electrode P2 for minimizing transmittance losses in the regions A and B.

Furthermore, as shown in C of FIG. 1, one of the first pixel electrode P1 and the second pixel electrode P2 inevitably overlaps the drain electrode of the thin film transistor.

SUMMARY OF THE INVENTION

Embodiments of the present invention provide a liquid crystal display device that allows the parasitic capacitance between the first pixel electrode and the neighboring data lines to be substantially the same as the parasitic capacitance between the second pixel electrode and the neighboring data lines, and a method of manufacturing the liquid crystal display device.

According to an embodiment, a liquid crystal display device includes first and second pixel electrodes formed at each pixel. The first and the second pixel electrodes are formed on the same layer and are insulated from each other. An electric field is generated between the first and second pixel electrodes.

The first pixel electrode is divided into two or more parts which are electrically connected to each other through a connection bridge. The connection bridge is formed by a conductive layer, which is different from a conductive layer forming the pixel electrode.

The first pixel electrode is capacitively coupled to the lower part of a neighboring first data line and the upper part of a neighboring second data line The second pixel electrode is capacitively coupled to the upper part of the neighboring first data line and the lower part of the neighboring second data line.

The distances and/or the overlapping areas between the pixel electrodes and their neighboring data lines are designed to make the parasitic capacitance between the first pixel electrode and neighboring first data line substantially the same as the parasitic capacitance between the second pixel electrode and neighboring first data line and to make the parasitic capacitance between the first pixel electrode and neighboring second data line substantially the same as the parasitic capacitance between the second pixel electrode and neighboring second data line.

DETAILED DESCRIPTION

Hereinafter, the present invention will be now described in detail with reference to the embodiments and the drawings.

Figure 2:
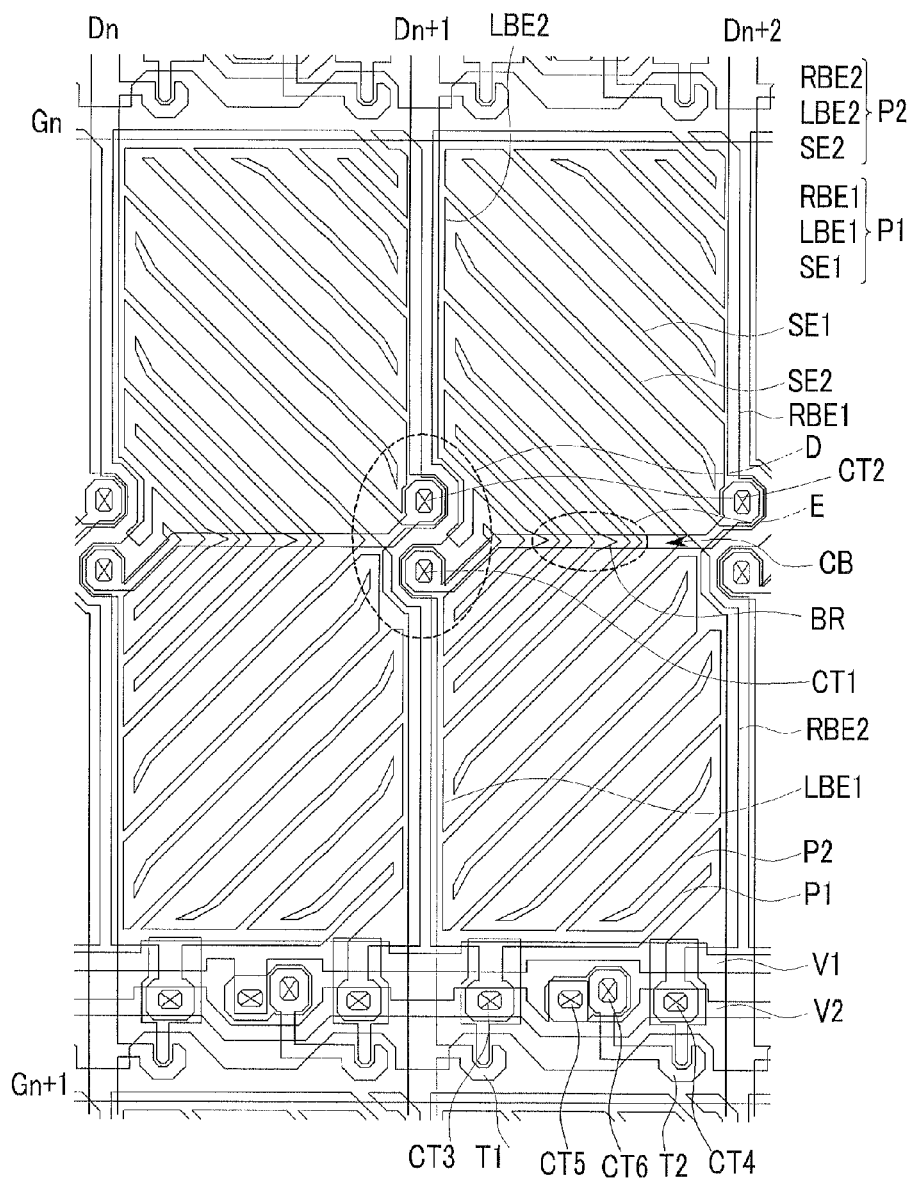
FIG. 2 is a plan view illustrating a pixel layout of a thin film transistor substrate according to an exemplary embodiment of the present invention.

Hereinafter, an exemplary embodiment of the present invention will be now described with reference to FIGS. 2-6. FIG. 2 is a plan view illustrating a pixel layout of a thin film transistor substrate according to an exemplary embodiment.

As shown in FIG. 2, a first thin film transistor T1 and a second thin film transistor T2 are formed at each of pixels where data lines Dn, Dn+1, and Dn+2 intersect gate lines Gn and Gn+1.

For each pixel, the source electrode of the first thin film transistor T1 is extended from the data lines Dn, Dn+1, and Dn+2, the drain electrode is connected to a first pixel electrode P1 through a third contact hole CT3, and the gate electrode is extended from the gate lines Gn and Gn+1. The source electrode of the second thin film transistor T2 is alternately connected to a first common voltage line Com1 or a second common voltage line Com2 through a fifth contact hole CT5 and a sixth contact hole CT6, the drain electrode is connected to the second pixel electrode P2 through a fourth contact hole CT4 and the gate electrode is extended from the gate lines Gn and Gn+1. Two different voltages that alternately change for every frame are applied to the first common voltage line Com1 and the second common voltage line Com2, respectively. To minimize line overlap and maximize aperture ratio, the first common voltage line Com1 and the second common voltage line Com2 may be located between the pixel electrodes P1 and P2 and the neighboring gate line Gn+1, and the fifth contact hole CT5 and the sixth contact hole CT6 may be located between the third contact hole CT3 and the fourth contact hole CT4. A portion of the second common voltage line Com2 adjacent to the fifth contact hole CT5 and the sixth contact hole CT6 may be bent toward the neighboring gate line Gn+1 to position the portion of the second common voltage line Com2 in the area between the gate electrodes of the first and second thin film transistors T1 and T2 so as to maximize the region where the pixel electrodes P1 and P2 are formed.

The source electrode of the second thin film transistor T2 is electrically connected to the first common voltage line Com1 or the second common voltage line Com2 via the fifth and sixth contact holes CT5 and CT6, and a contact electrode (not indicated by symbol). As a result, a manufacturing process is simplified.

The first pixel electrode P1 includes backbone electrodes LBE1 and RBE1 and a plurality of spine electrodes SE1 extending from the backbone electrodes LBE1 and RBE1. The second pixel electrode P2 includes backbone electrodes LBE2 and RBE2 and a plurality of spine electrodes SE2 extending from the backbone electrodes LBE2 and RBE2. The plurality of spine electrodes SE1 and the plurality of spine electrodes SE2 are alternately positioned with each other and extend substantially parallel to each other. The extension direction of the spine electrodes SE1 and SE2 makes an acute angle, such as, for example, 45°, or an obtuse angle, such as, for example, 135°, with the direction of the transmission axis of a polarizer (not shown) in a final product so that two domains are made based on an average azimuth angle of the electric field direction in each pixel. Thereby, viewing angle characteristics may be improved. In addition, the viewing angle characteristics of the liquid crystal display may be further improved by varying the intensity of an electric field generated between the spine electrodes SE1 and SE2 by changing the interval between the spine electrodes SE1 and SE2.

The left backbone electrode LBE1 of the first pixel electrode P1 is capacitively coupled to the lower part of the neighboring left data line Dn+1, the right backbone electrode RBE1 of the first pixel electrode P1 is capacitively coupled to the upper part of the neighboring right data line Dn+2, the left backbone electrode LBE2 of the second pixel electrode P2 is capacitively coupled to the upper part of the neighboring left data line Dn+1, and the right backbone electrode RBE2 of the first pixel electrode P2 is capacitively coupled to the lower part of the neighboring right data line Dn+2. In this case, if (1) a portion where the left backbone electrode LBE1 of the first pixel electrode P1 overlaps the neighboring left data line Dn+1 is substantially identical in area to a portion where the left backbone electrode LBE2 of the second pixel electrode P2 overlaps the neighboring left data line Dn+1, (2) a portion where the right backbone electrode RBE1 of the first pixel electrode P1 overlaps the neighboring right data line Dn+2 is substantially identical in area to a portion where the right backbone electrode RBE2 of the second pixel electrode P2 overlaps the neighboring right data line Dn+2, and (3) the first pixel electrode P1 and the second pixel electrode P2 are formed on a same layer, then the parasitic capacitance between the first pixel electrode P1 and the neighboring data lines Dn+1 and Dn+2 becomes substantially the same as the parasitic capacitance between the second pixel electrode P2 and the neighboring data lines Dn+1 and Dn+2, and thus, even though a voltage applied to one of the neighboring data lines Dn+1 and Dn+2 varies independently from a voltage applied to the other data line, there is no substantial difference in voltages applied between the first pixel electrode P1 and the second pixel electrode P2. But, if the above described areas are completely the same, the parasitic capacitance of the first pixel electrode P1 becomes slightly bigger than the parasitic capacitance of the second pixel electrode P2 due to the first contact hole CT1, the second contact hole CT2, and the connection bridge CB. Considering this, the overlapping areas may be adjusted.

The left backbone electrode LBE1 of the first pixel electrode P1 is connected to the connection bridge CB through the first contact hole CT1 and the right backbone electrode RBE1 of the first pixel electrode P1 is connected to the connection bridge CB through the second contact hole CT2 so that the left backbone electrode LBE1 and the right backbone electrode RBE1 are electrically connected each other. In this case, the transmittance loss can be minimized by forming the connection bridge CB at the border region between the upper domain and lower domain where transmittance is relatively low because the electric field is not clearly defined.

Figure 1:
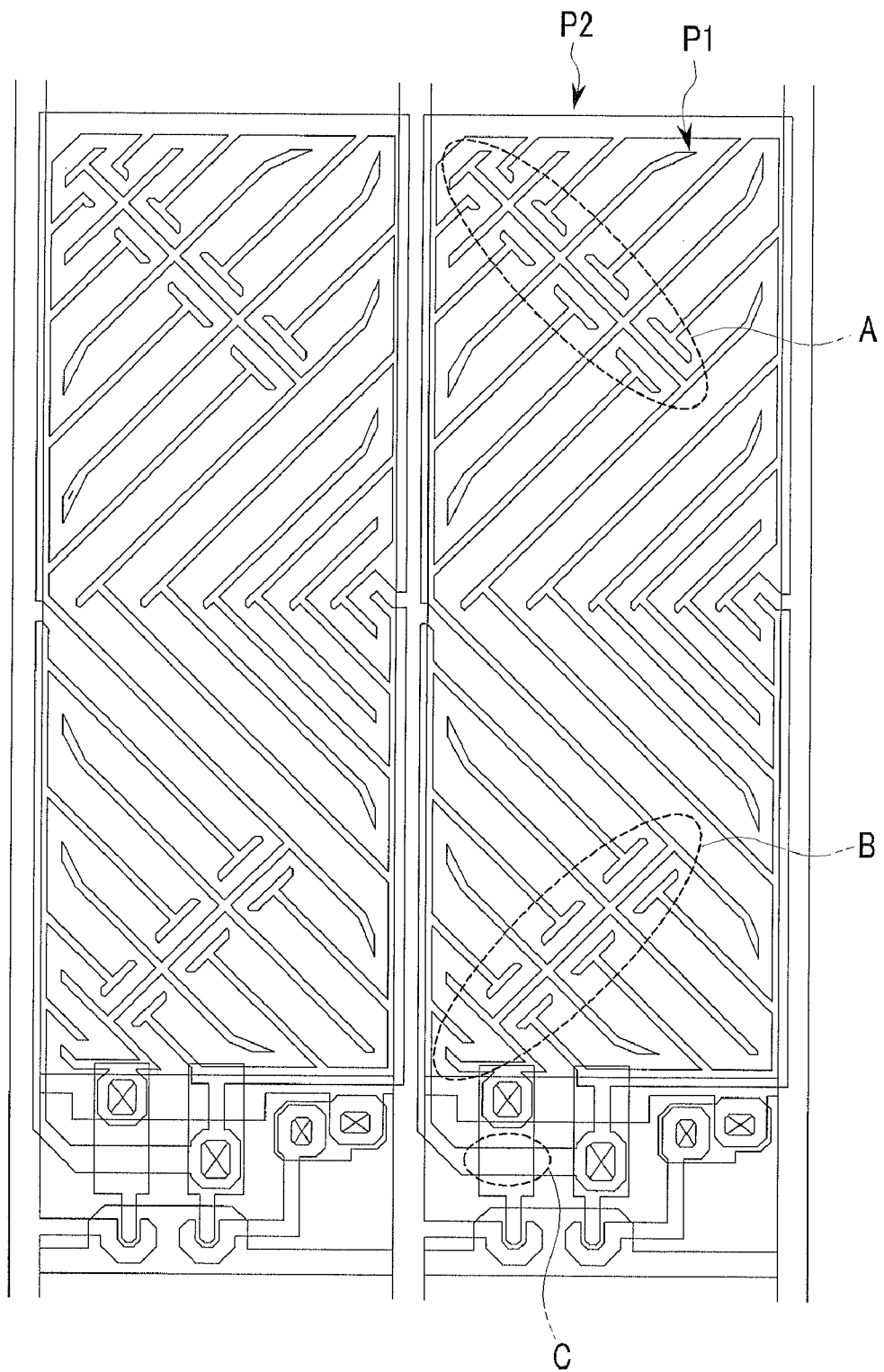
FIG. 1 is a plan view illustrating a pixel layout of a thin film transistor substrate according to the related art.

Through the above described structure, while the parasitic capacitances of the first pixel electrode P1 and the second pixel electrode P2 are maintained to be equal or substantially equal, the textures generated in the display region can be minimized because the shape of the pixel electrodes and the connection structure can be simplified compared to the related art structure shown in FIG. 1.

Figure 3:
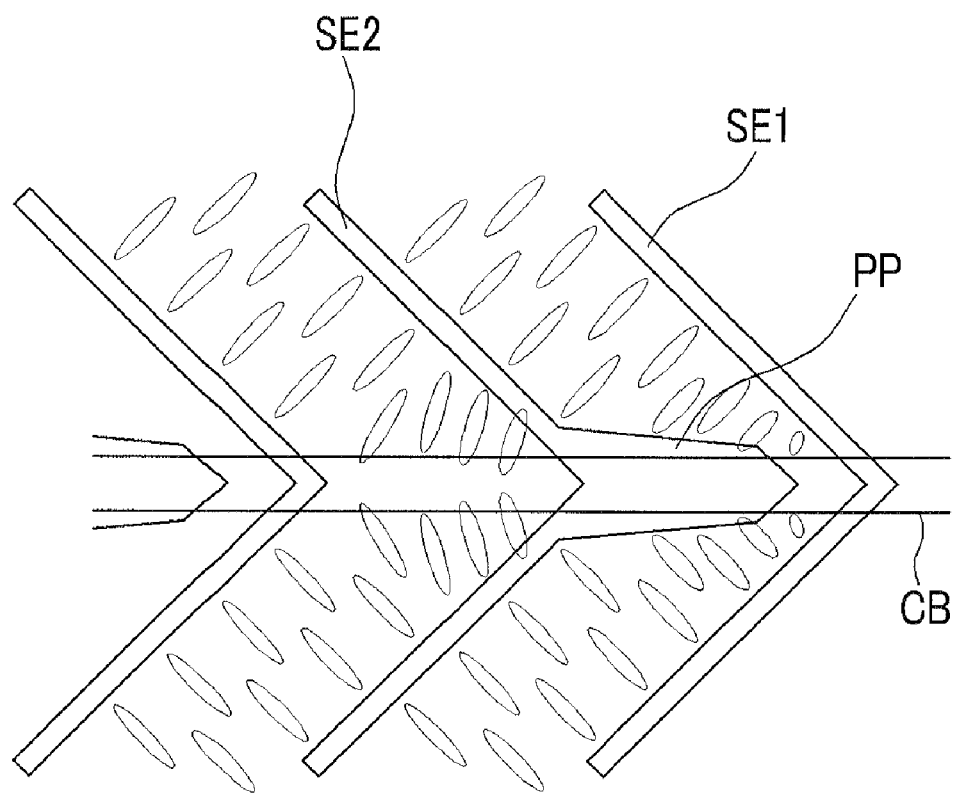
FIG. 3 is a magnified plan view of part E of FIG. 2.

FIG. 3 is a magnified plan view of part E of FIG. 2.

As shown in FIG. 3, the spine electrode SE2 of the second pixel electrode P2 includes a protrusion part PP that protrudes from the part intersecting the connection bridge CB in the extension direction of the connection bridge CB. The extension direction of the protrusion part PP makes an obtuse angle of more than, for example, 135° with the extension direction of two parts of the spine electrode SE2 extending from the protrusion part PP, respectively. The protrusion part PP is mostly wider than the connection bridge CB and makes a lateral electric field with the spine electrode SE1 of the first pixel electrode P1.

The connection bridge CB is connected to the first pixel electrode P1 and the same voltage as that of the first pixel electrode P1 is applied to the connection bridge CB. Accordingly, without the protrusion part PP, an electric field is not sufficiently generated in the area where the connection bridge CB crosses and makes an acute angle with the first pixel electrode P1. Thus, even though a gray voltage is applied to the area, the liquid crystal molecules at the area remain vertically aligned, thus are recognized as texture. Thus, the protrusion part PP may be formed to generate an electric field between the protrusion part PP and the first pixel electrode P1 according to an exemplary embodiment so that texture is not observed.

Figure 4:
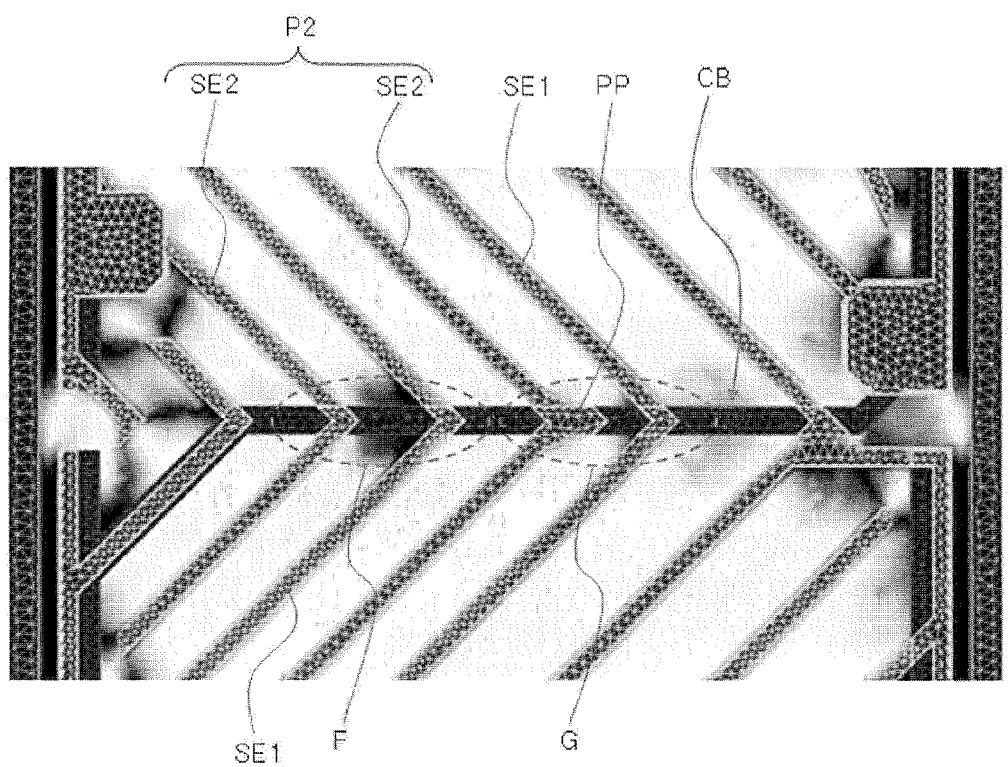
FIG. 4 is a simulation view comparing the amount of texture generated between a structure with a protrusion part PP and a structure with no protrusion part.

FIG. 4 is a simulation view comparing the amount of texture generated between a structure with the protrusion part PP at the spine electrode SE2 of the second pixel electrode P2 and a structure without the protrusion part PP. As can be seen in FIG. 4, textures, which are identified as dark portions, are generated less at region G with the protrusion part PP than at region F without the protrusion part PP.

Figure 5:
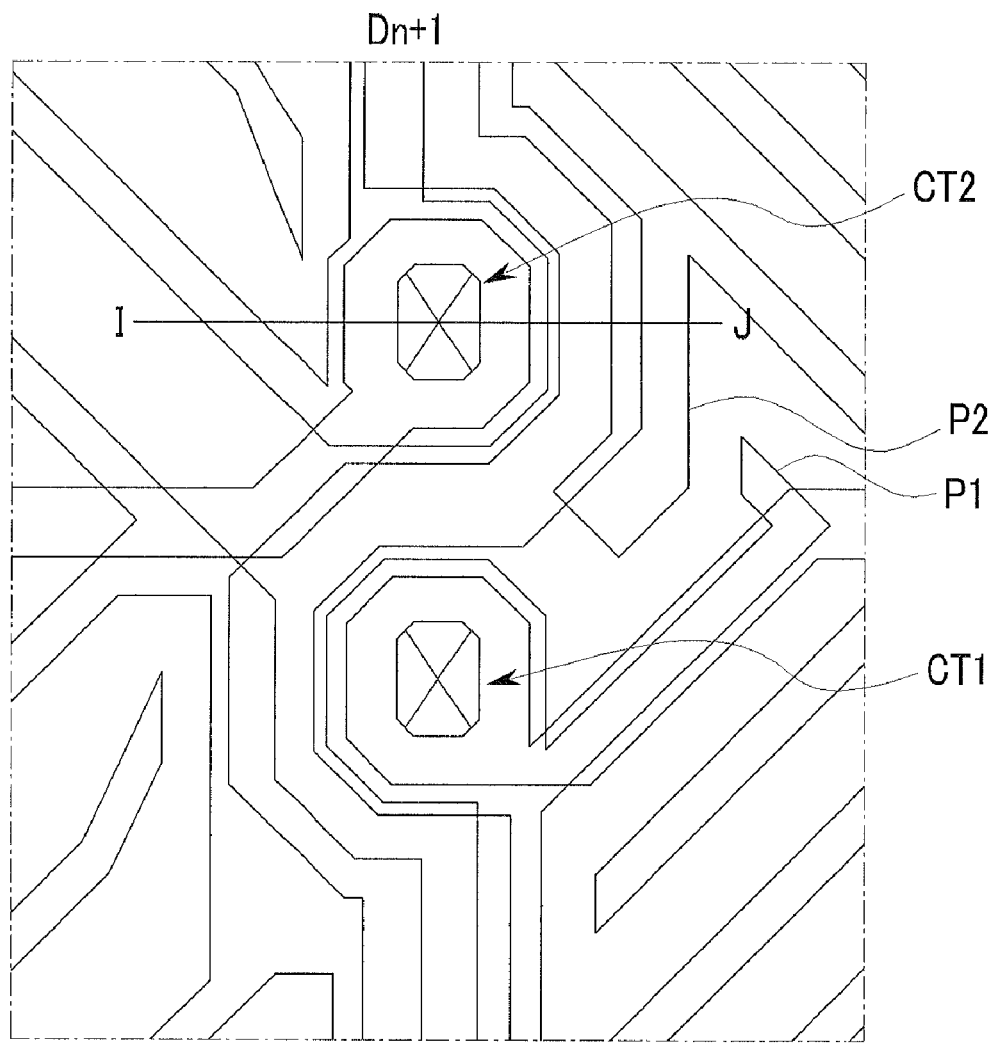
FIG. 5 is a magnified plan view of part D of FIG. 2.

FIG. 5 is a magnified plan view of part D of FIG. 2. As shown in FIG. 5, the second contact hole CT2 of one pixel and the first contact hole CT1 of a neighboring pixel are arranged at upper and lower portions with respect to each other. The data line Dn+1 curves around the second contact hole CT2 and the first contact hole CT1, and around protruded parts of the first and second pixel electrodes P1 and P2, thereby minimizing reduction of the aperture ratio. The width and inclined direction of the second pixel electrode P2 are determined such that the second pixel P2 may overlap an edge of the data line Dn+1 curving around the first contact hole CT1 and the second contact hole CT2. The transmittance loss due to the contact holes CT1 and CT2 can be minimized through the above-described structure because the transmittance of the pixel electrode area is relatively smaller than the transmittance of the interval area between the pixel electrodes. If the first and the second contact holes CT1 and CT2 are arranged side by side, not up and down, then the transmittance loss becomes relatively bigger because aperture area is reduced more due to the contact holes CT1 and CT2. If the curving direction of the data line Dn+1 is reversed, then the transmittance loss becomes relatively bigger as well because the aperture area is reduced more due to the data line Dn+1.

Figure 6:
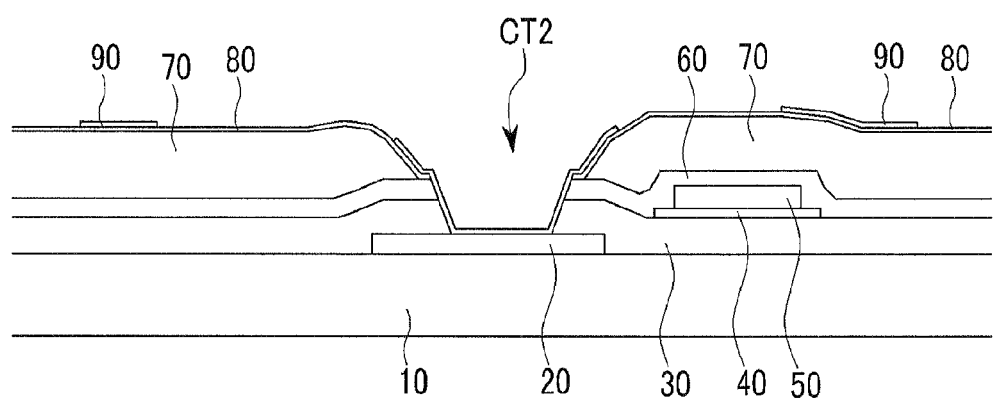
FIG. 6 is a cross-sectional view taken along line I-J of FIG. 5.

FIG. 6 is a cross-sectional view taken along line I-J of FIG. 5. Referring to FIG. 2 and FIG. 6, a thin film transistor substrate according to an exemplary embodiment will be described.

A first conductive pattern 20 including the gate lines Gn and Gn+1, the gate electrodes of the first and the second thin film transistors T1 and T2, the first and the second common voltage lines Com1 and Com2, and the connection bridge CB is formed on a transparent insulating substrate 10. The first conductive pattern 20 may be a single layer or multilayer. All types of suitable structures and materials, as already known or will be known, may be employed for the first conductive pattern 20.

Next, a first insulating layer 30 is formed on the insulating substrate 10 and the first conductive pattern 20. The first insulating layer 30 may be a single layer or multilayer and all types of suitable structures and materials, as already known or will be known, may be employed for the first insulating layer 30.

Next, a semiconductor pattern 40 including the channels of the first and the second thin film transistors T1 and T2 is formed on the first insulating layer 30. The semiconductor pattern 40 may include an intrinsic semiconductor layer and an ohmic semiconductor layer of which thickness is relatively thin. The semiconductor pattern 40 may be formed of amorphous silicon. Without being limited to amorphous silicon, however, all types of suitable materials having characteristics of semiconductors, as already known or will be known, such as, for example, poly silicon, oxide semiconductor, organic compound semiconductor, or the like, may be used as a material for the semiconductor pattern 40.

Next, a second conductive pattern 50 including the data lines Dn, Dn+1, and Dn+2, the drain electrodes and the source electrodes of the first and the second thin film transistors T1 and T2 is formed. The second conductive pattern 50 may be a single layer or multilayer. All types of suitable structures and materials, as already known or will be known, may be employed for the second conductive pattern 50.

As shown in FIG. 6, the semiconductor pattern 40 may be formed under the whole lower surface of the second conductive pattern 50 according to a manufacturing process. This structure is formed by sequentially stacking a second conductive layer and a semiconductor layer, followed by simultaneously etching the two layers.

Next, a second insulating layer 60 is formed on the second conductive pattern 50. The second insulating layer 60 may be a single layer or multilayer. All types of suitable structures and materials, as already known or will be known, may be used for the second insulating layer 60.

Subsequently, a color filter layer 70 is formed on the second insulating layer 60. The color filter layer 70 may have a structure that red, green, and blue filters are arranged alternately and repeatedly. Various types of shapes and combinations may apply to the color filter layer 700. All types of suitable layer structures and materials, as already known or will be known, may be used for the color filter layer 70.

Next, a third insulating layer 80 is formed on the color filter layer 70. The third insulating layer 80 may be formed of an inorganic insulating material, such as SiNx or SiOx. All types of suitable structures and materials, as already known or will be known, may be employed for the third insulating layer 80.

Next, a third conductive pattern 90 including the first and the second pixel electrodes P1 and P2, and the contact electrodes of the first, second, third, fourth, fifth, and sixth contact holes CT1, CT2, CT3, CT4, CT5, and CT6 is formed on the third insulating layer 80. The third conductive pattern 90 may be formed of a transparent conductive material such as ITO or IZO. All types of suitable structures and materials, as already known or will be known, may be employed for the third conductive pattern 90.

According to an exemplary embodiment, as shown in FIG. 2, the pixel electrodes P1 and P2 can overlap the data lines Dn, Dn+1, and Dn+2 in many parts because the color filter layer 70 and the second insulating layer 60 are positioned between the pixel electrodes P1 and P2 and the data lines Dn, Dn+1, and Dn+2. Accordingly, the transmittance may be maximized. If only the second insulating layer 60 is positioned between the pixel electrodes P1 and P2 and the data lines Dn, Dn+1, and Dn+2 without the color filter layer 70 and the third insulating layer 80, the transmittance is not adequately maximized because it is difficult to make the pixel electrodes P1 and P2 sufficiently overlap the data lines Dn, Dn+1, and Dn+2. In the absence of the color filter layer 70 and the third insulating layer 80, making the pixel electrodes P1 and P2 sufficiently overlap the data lines Dn, Dn+1, and Dn+2 may cause various problems due to an increase of the whole parasitic capacitances of the data lines Dn, Dn+1, and Dn+2, despite solving the problem of a parasitic capacitance difference between the first pixel electrode P1 and the second pixel electrode P2. In addition, when the line structures including the thin film transistors and the color filter layers are formed on the same substrate, quality deterioration caused by a misalignment between upper and lower substrates can be suppressed. No further manufacturing process or material is required because the color filter layers should be formed on at least one of upper and lower substrates.

According to an exemplary embodiment, the first conductive pattern 20 is used as the connection bridge CB. However, the invention is not limited thereto, but other conductive patterns, such as, for example, the second conductive pattern 50, may be also used as the connection bridge CB. But, if the second conductive pattern 50 is used as the connection bridge CB, an electric field may be distorted between the pixel electrodes P1 and P2 since the distance between the second conductive pattern 50 and the pixel electrodes P1 and P2 is relatively smaller than the distance between the first conductive pattern 20 and the pixel electrodes P1 and P2.

Various manufacturing processes known to one of ordinary skill, such as a photolithography process, may be used to form the above-described structure.

Figure 7:
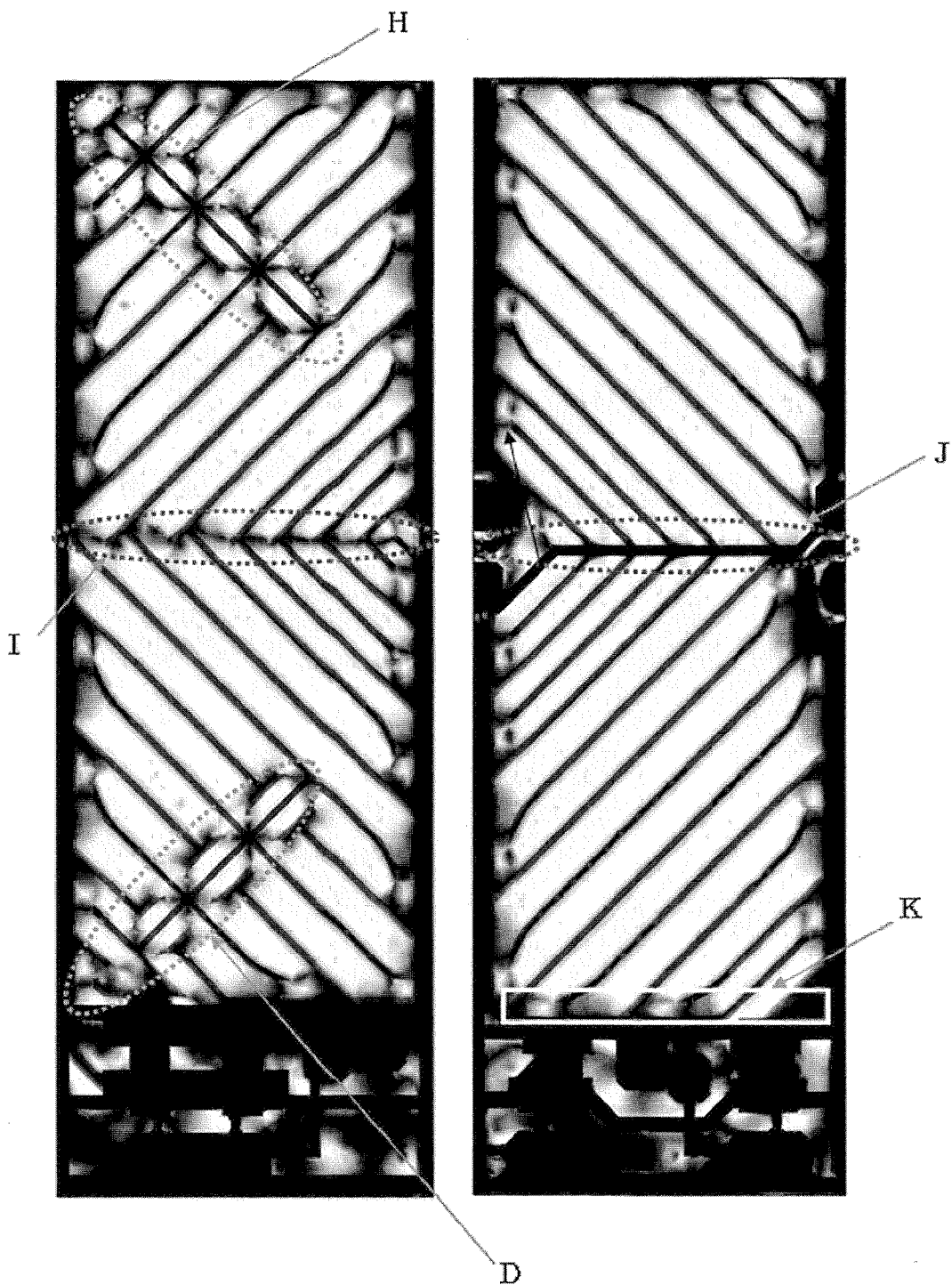
FIG. 7 is a simulation view comparing transmittance of a thin film transistor according to the exemplary embodiment shown in FIG. 2 with transmittance of a thin film transistor of the related art.

FIG. 7 is a simulation view comparing the transmittance of a thin film transistor according to an exemplary embodiment with the transmittance of a thin film transistor according to the related art. Serious textures occurred in region H and region D in the case of a liquid crystal display according to the related art, as can be seen at the left side of FIG. 7 while no textures appeared in the case of a liquid crystal display according to an exemplary embodiment, as can be seen at the right side of FIG. 7. Furthermore, the overall transmittance was increased in the case of a liquid crystal display according to an exemplary embodiment because the area for the pixel electrodes was increased as much as region K. According to an exemplary embodiment, region J had reduced transmittance due to the connection bridge, but the transmittance loss was not large. This is because region I according to the related art that corresponds to region J also has reduced transmittance due to unclear electric field direction.

Figure 8:
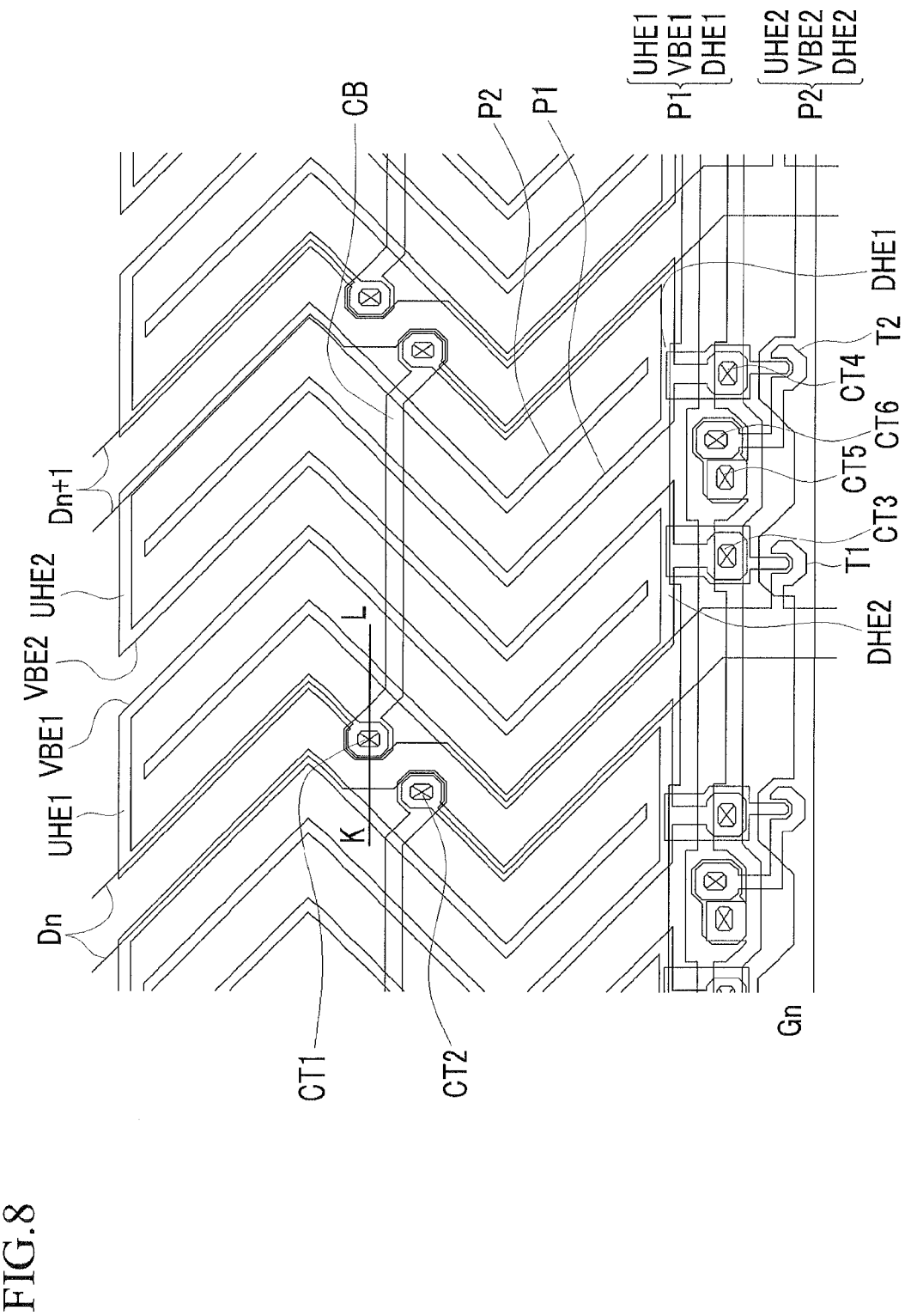
FIG. 8 is a plan view illustrating a pixel layout of a thin film transistor substrate according to an exemplary embodiment of the present invention.
Figure 9:
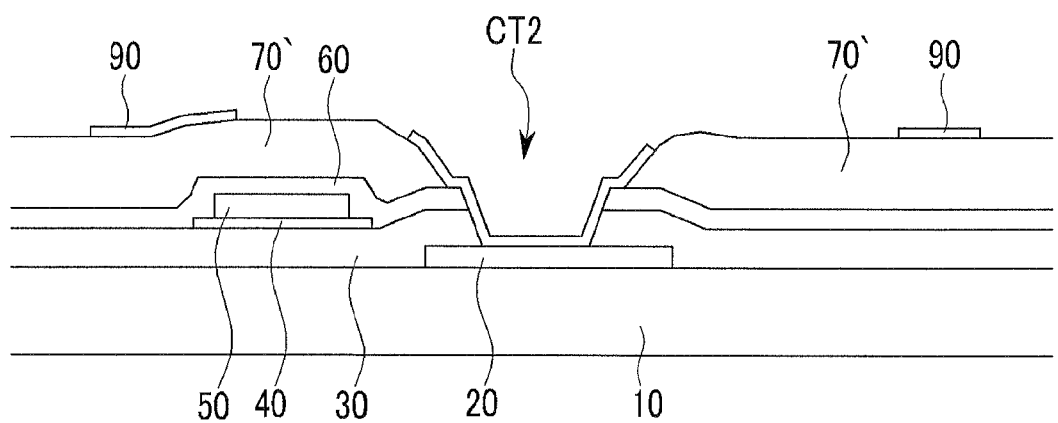
FIG. 9 is a cross-sectional view taken along line K-L of FIG. 8.

An exemplary embodiment of the present invention will be now described with reference to FIGS. 8 and 9. FIG. 8 is a plan view illustrating a pixel layout of the thin film transistor substrate according to an exemplary embodiment and FIG. 9 is a cross-sectional view taken along line K-L of FIG. 8. The same reference characters refer to the same or substantially the same elements as those described in connection with the embodiment of FIGS. 2-7.

Unlike the exemplary embodiment described in connection with FIGS. 2-7 exemplifying a rectangular pixel structure, the exemplary embodiment described in connection with FIGS. 8-9 exemplifies a bent pixel structure. In addition, an organic layer 70' is positioned between the pixel electrodes P1 and P2 and the data lines Dn and Dn+1 instead of the color filter layer 70. In the bent pixel structure, the direction of an electric field is perpendicular to the outline of the pixel so that the occurrence of textures in the border area of the pixel may be minimized whereas a load to the data lines Dn and Dn+1 may be increased due to increased length of the data lines Dn and Dn+1. According to an exemplary embodiment, however, if a thick insulating layer, such as an organic layer, is provided between the pixel electrodes P1 and P2 and the data lines Dn and Dn+1 to suppress the parasitic capacitance, the data lines Dn and Dn+1 may be formed to be straight under the pixel electrodes P1 and P2. However, the straight data line structure may be difficult to apply to a situation where the parasitic capacitance between the first pixel electrode P1 and the neighboring data lines Dn and Dn+1 is to be matched with the parasitic capacitance between the second pixel electrode P2 and the neighboring data lines Dn and Dn+1.

As shown in FIG. 8, the pixel electrodes P1 and P2 according to an exemplary embodiment include upper horizontal electrodes UHE1 and UHE2, lower horizontal electrodes DHE1 and DHE2, and vertical bent electrodes VBE1 and VBE2 extending from the upper horizontal electrodes UHE1 and UHE2 and the lower horizontal electrodes DHE1 and DHE2, respectively. The vertical bent electrodes VBE1 and VBE2 are parallel to each other while being spaced apart from each other at a predetermined interval and are bent according to the shape of pixel. The interval between the vertical bent electrodes VBE1 and VBE2 may be variously determined as in the exemplary embodiment described in connection with FIGS. 2-7. The left and right parts of the first pixel electrode P1 are connected to each other through the connection bridge CB that passes under the pixel electrodes P1 and P2, and the left and right parts of the second pixel electrode P2 are connected to each other through the vertical bent electrode VBE2 that connects the upper horizontal electrode UHE2 with the down horizontal electrode DHE2. The leftmost vertical bent electrode VBE1 of the first pixel electrode P1 is capacitively coupled to the upper part of the neighboring left data line Dn, and the rightmost vertical bent electrode VBE1 is capacitively coupled to the lower part of the neighboring right data line Dn+1. The leftmost vertical bent electrode VBE2 of the second pixel electrode P2 is capacitively coupled to the lower part of the neighboring left data line Dn, and the rightmost vertical bent electrode VBE2 is capacitively coupled to the upper part of the neighboring right data line Dn+1. In this case, if (1) the area by which the leftmost vertical bent electrode VBE1 of the first pixel electrode P1 overlaps the neighboring left data line Dn is substantially the same as the area by which the leftmost vertical bent electrode VBE2 of the second pixel electrode P2 overlaps the neighboring left data line Dn, and (2) the area by which the rightmost vertical bent electrode VBE1 of the first pixel electrode P1 overlaps the neighboring right data line Dn+1 is substantially the same as the area by which the rightmost vertical bent electrode VBE2 of the second pixel electrode P2 overlaps the neighboring right data line Dn+1, with the first pixel electrode P1 and the second pixel electrode P2 formed on the same layer, then the parasitic capacitance between the first pixel electrode P1 and the neighboring data lines Dn and Dn+1 may be substantially the same as the parasitic capacitance between the second pixel electrode P2 and the neighboring data lines Dn and Dn+1, and thus, even though a voltage applied to one of the neighboring data lines Dn and Dn+1 varies independently from a voltage applied to the other data line, there is no substantial difference in voltages applied between the first pixel electrode P1 and the second pixel electrode P2. The effects according to the first and the second contact holes CT1 and CT2 and the connection bridge CB are the same or substantially the same as those described in the exemplary embodiment of FIGS. 2-7.

If a protrusion part is formed at the crossing part of the connection bridge CB and the second pixel electrode P2 as in the exemplary embodiment of FIGS. 2-7, not only an obtuse angle, but also an acute angle that may cause textures may be made between the protrusion part and the second pixel electrode P2. Accordingly, in this embodiment, the protrusion part may be omitted.

The connection bridge is positioned in the middle of the pixel. Otherwise, the parasitic capacitances of the first and the second pixel electrodes might not be symmetrical to each other. According to an exemplary embodiment, the pixel is bent twice and thus the connection bridge CB is not located at a border where the direction of the electric field is changed. However, in a case where the pixel is bent an odd number of times, transmittance loss can be minimized by forming the connection bridge CB at the middle border where the direction of the electric field is changed.

Since a connection between the elements of the thin film transistor substrate according to the exemplary embodiment of FIGS. 8-9 is substantially similar to that according to the exemplary embodiment of FIGS. 2-7, further detailed description is omitted.

Hereinafter, an exemplary embodiment of the present invention will be described with reference to FIG. 10 and FIG. 11.

Figure 10:
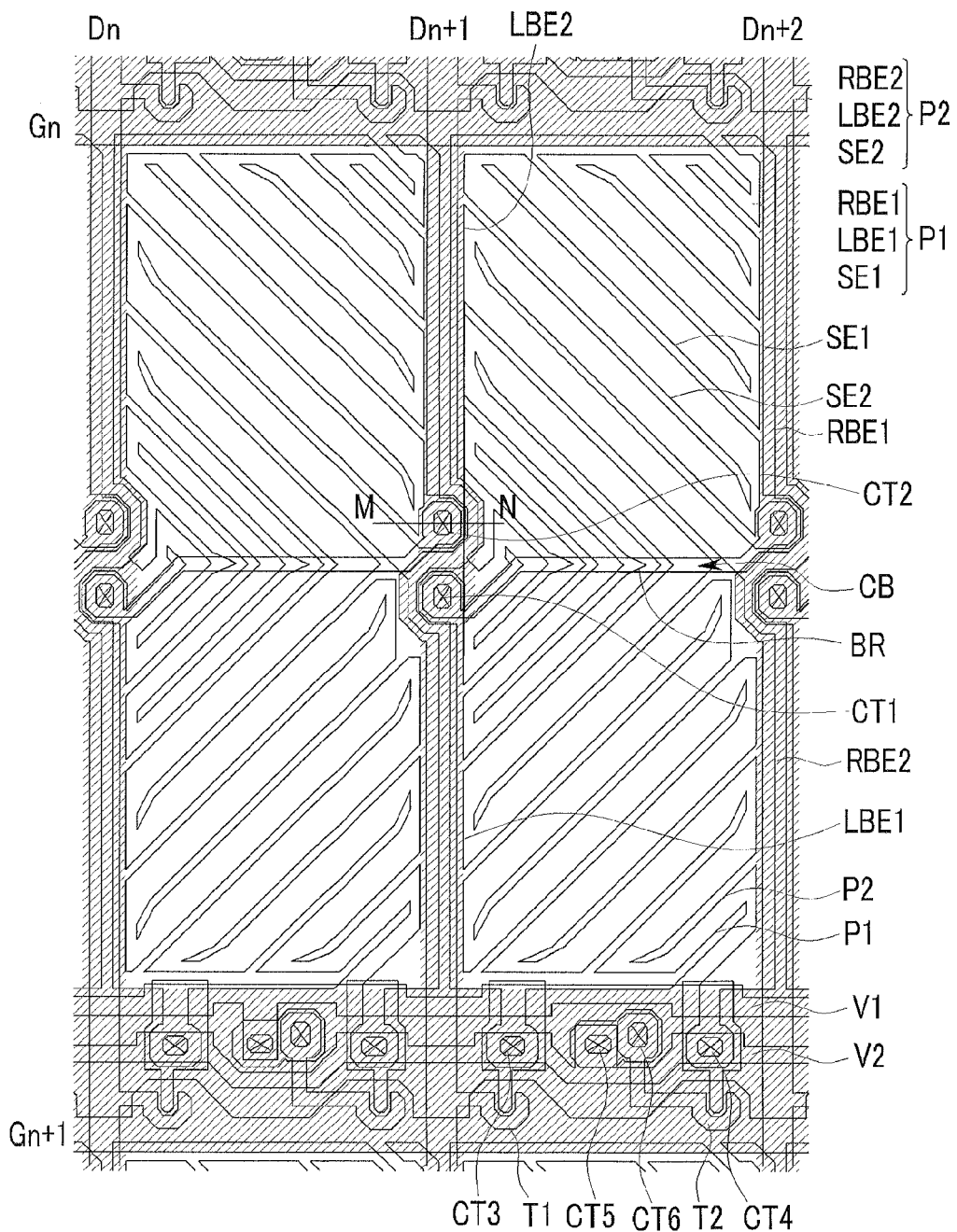
FIG. 10 is a plan view illustrating a pixel layout of a thin film transistor according to an exemplary embodiment of the present invention.
Figure 11:
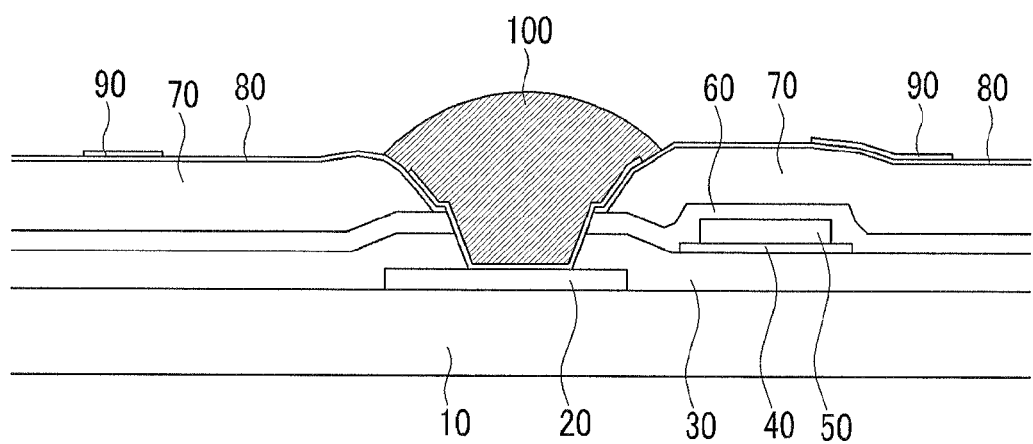
FIG. 11 is a cross-sectional view taken along line M-N of FIG. 10.

FIG. 10 is a plan view illustrating a pixel layout of a thin film transistor substrate according to an exemplary embodiment and FIG. 11 is a cross-sectional view taken along line M-N of FIG. 10. The same reference characters refer to the same or substantially the same elements as those described in connection with the embodiment of FIGS. 2-7.

The pixel layout according to the present exemplary embodiment is the same as that according to the exemplary embodiment of FIGS. 2-7 except that a light shielding pattern 100 is formed on the third insulating layer 80. As shown in FIG. 10 and FIG. 11, the light shielding pattern 100 is formed at the whole non-transmission region through which light is not transmitted. According to the present embodiment, when forming a color filter layer and a light shielding pattern on a thin film transistor substrate, misalignment between an upper substrate and a lower substrate may be prevented.

Since a connection between the elements of the thin film transistor substrate according to the exemplary embodiment of FIGS. 10-11 is substantially similar to that according to the exemplary embodiment of FIGS. 2-7, further detailed description is omitted.

Hereinafter, an exemplary embodiment of the present invention will be described with reference to FIG. 12 and FIG. 13.

Figure 12:
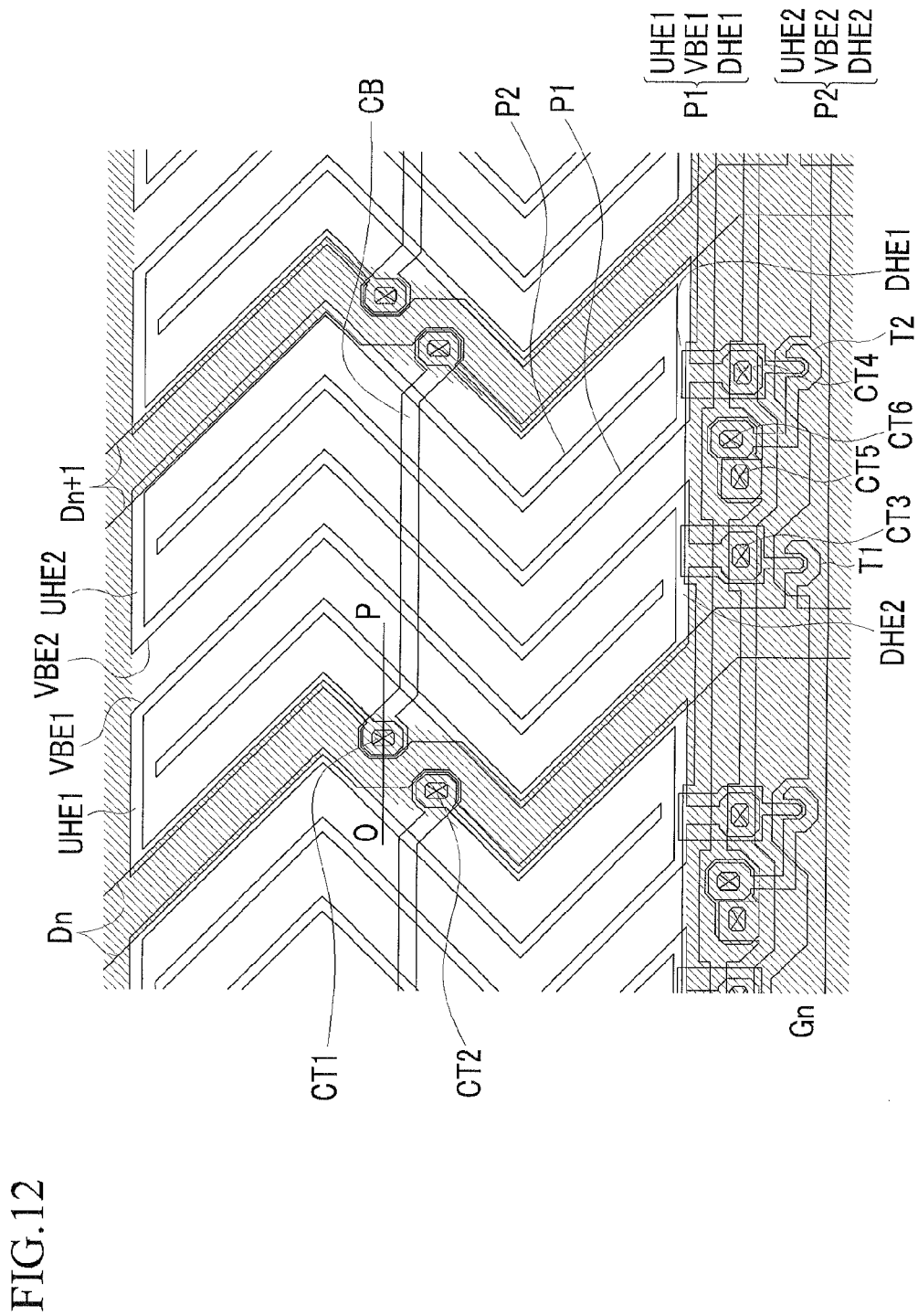
FIG. 12 is a plan view illustrating a pixel layout of a thin film transistor according to an exemplary embodiment of the present invention.
Figure 13:
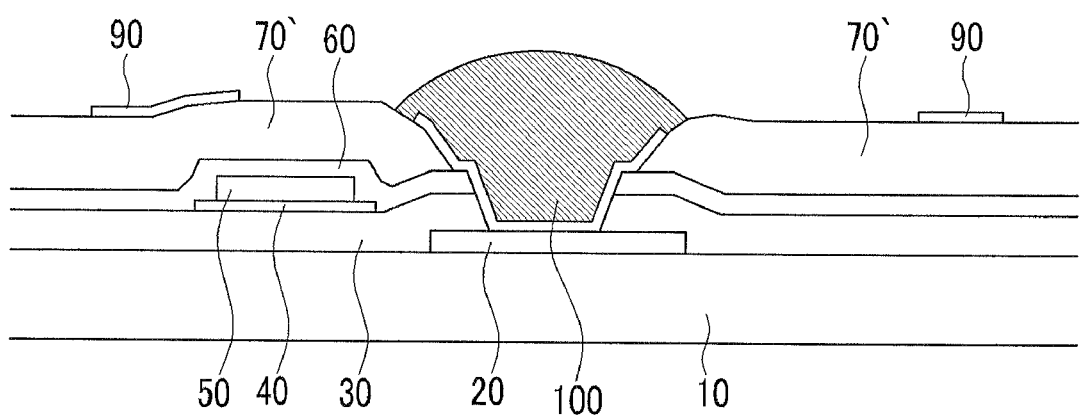
FIG. 13 is a cross-sectional view taken along line O-P of FIG. 12.

FIG. 12 is a plan view illustrating a pixel layout of a thin film transistor substrate according to an exemplary embodiment and FIG. 13 is a cross-sectional view taken along line O-P of FIG. 12. The same reference characters refer to the same or substantially the same elements as those described in connection with FIGS. 8-9.

The pixel layout according to the present exemplary embodiment is the same as that according to the exemplary embodiment of FIGS. 8-9 except that the light shielding pattern 100 is formed on the organic insulating layer 70'. As shown in FIG. 12 and FIG. 13, the light shielding pattern 100 is formed at the whole non-transmission region through which light is not transmitted.

Since a connection between the elements of the thin film transistor substrate according to the exemplary embodiment of FIGS. 11-12 is substantially similar to the exemplary embodiment of FIGS. 8-9, further detailed description is omitted.

Hereinafter, an exemplary embodiment of the present invention will be described with reference to FIG. 14 and FIG. 15.

Figure 14:
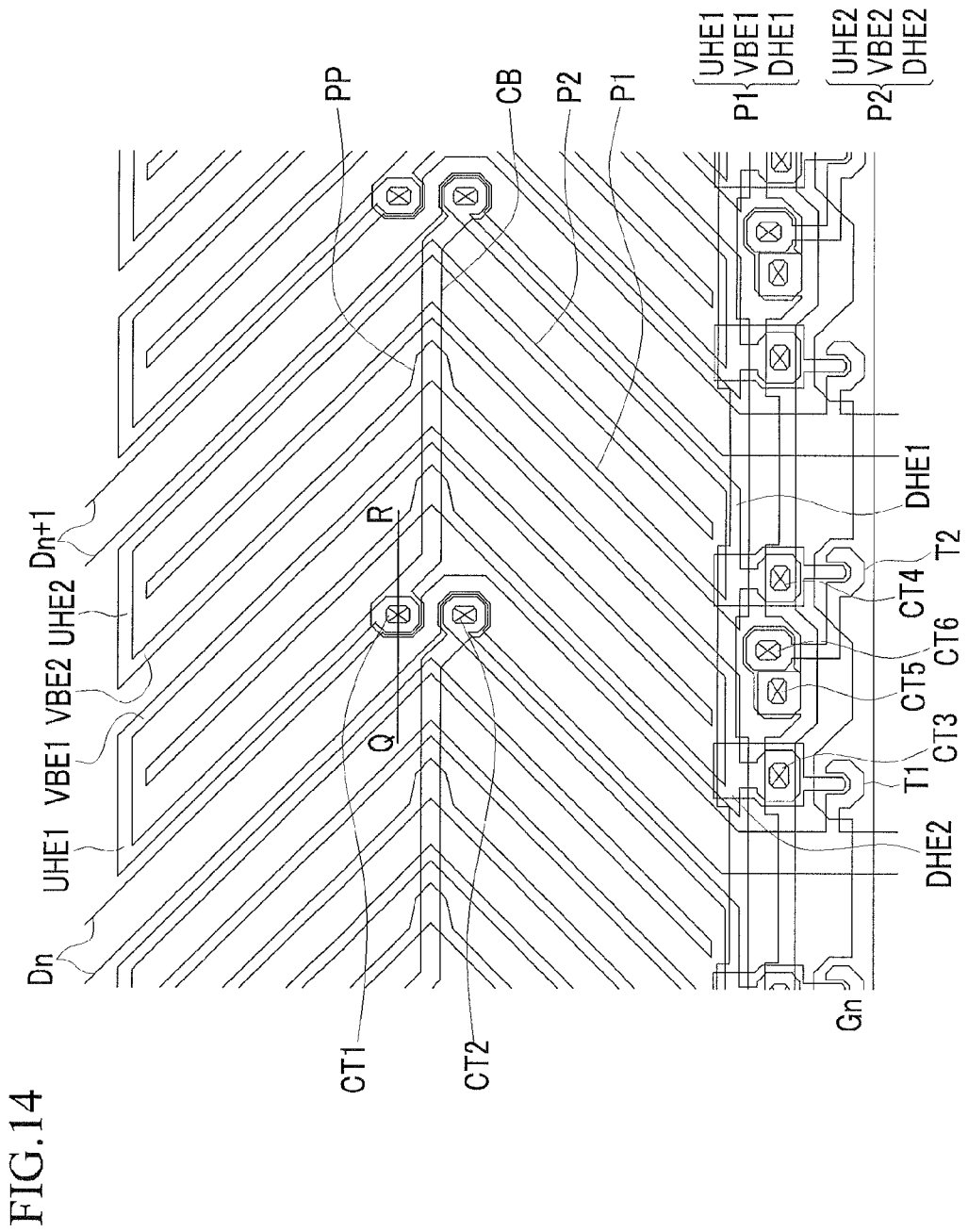
FIG. 14 is a plan view illustrating a pixel layout of a thin film transistor according to an exemplary embodiment of the present invention.
Figure 15:
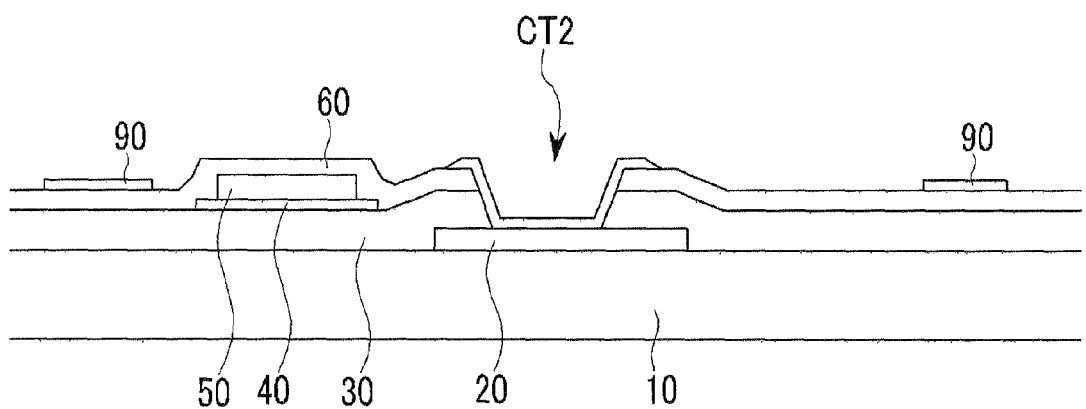
FIG. 15 is a cross-sectional view taken along line Q-R of FIG. 14.

FIG. 14 is a plan view illustrating a pixel layout of a thin film transistor substrate according to an exemplary embodiment and FIG. 15 is a cross-sectional view taken along line Q-R of FIG. 14. The same reference characters refer to the same or substantially the same elements as those described in connection with the embodiment of FIGS. 8-9.

The configuration according to the exemplary embodiment of FIGS. 14-15 is basically similar to that according to the exemplary embodiment of FIGS. 8-9 except that the vertical bent electrodes VBE1 and VBE2 are bent just one time and the connection bridge CB is located at the bending part to minimize the transmittance loss. At a portion of crossing the connection bridge CB, the vertical bending electrode VBE2 of the second pixel electrode P2 includes a protrusion part PP that protrudes in the extension direction of the connection bridge CB. The extension direction of the protrusion part PP makes an obtuse angle of more than, for example, 135° with the extension direction of two portions of the vertical bending electrode VBE2, which extend from the protrusion part PP. A majority portion of the protrusion part PP is wider than the connection bridge CB so that the protrusion part PP generates a lateral electric field in conjunction with the vertical bending electrode VBE1 of the first pixel electrode P1.

As shown in FIG. 15, the exemplary embodiment does not include an organic insulating layer, which is different from the exemplary embodiments of FIGS. 8-9 and 12-13. Because an organic insulating layer is omitted, it is desirable to reduce the parasitic capacitance by forming suitable intervals between the outermost vertical bending electrodes VBE1 and VBE2 and the left and right data lines Dn and Dn+1.

Since a connection between the elements of the thin film transistor according to the exemplary embodiment of FIGS. 14-15 is substantially similar to the exemplary embodiment of FIGS. 8-9, further detailed description is omitted.

The above-described thin film transistor substrate according to exemplary embodiments of the present invention should not be limited to the above embodiments but various modifications may be made thereto, such as having a different pixel layout or a modified architecture. Though the connection bridge is formed as one conductive layer in the above-mentioned embodiments, it may be formed as two or more layers.

What is claimed is:

1. A liquid crystal display device, comprising:
   a first insulating substrate;
   a gate line and a data line formed on the first insulating substrate and crossing each other;
   a first pixel electrode formed on the first insulating substrate and including a first part and a second part which are physically separated;
   a second pixel electrode formed on the first insulating substrate and forming an electric field with the first pixel electrode;
   a connection bridge including at least one conductive layer and electrically connecting the first part with the second part through a contact hole; and
   at least one insulating layer positioned between the first pixel electrode and the connection bridge, wherein the contact hole is formed in the at least one insulating layer.

2. The liquid crystal display device of claim 1, wherein the data line includes a first data line and a second data line, wherein the first part is capacitively coupled to the first data line and the second part is capacitively coupled to the second data line.

3. The liquid crystal display device of claim 2, wherein the second pixel electrode is capacitively coupled to both the first data line and the second data line.

4. The liquid crystal display device of claim 3, wherein the second pixel electrode is physically one body.

5. The liquid crystal display device of claim 3, wherein a capacitance between the first pixel electrode and the first data line is substantially the same as a capacitance between the second pixel electrode and the first data line, and a capacitance between the first pixel electrode and the second data line is substantially the same as a capacitance between the second pixel electrode and the second data line.

6. The liquid crystal display device of claim 1, wherein the contact hole includes a first contact hole and a second contact hole, wherein the connection bridge is connected to the first part through the first contact hole and to the second part through the second contact hole, and wherein the first contact hole of a pixel and the second contact hole of a neighboring pixel are arranged in an extension direction of the data line.

7. The liquid crystal display device of claim 6, wherein the data line curves around the first contact hole of the pixel and the second contact hole of the neighboring pixel.

8. The liquid crystal display device of claim 1, further comprising:
a second insulating substrate facing the first insulating substrate;
a liquid crystal layer positioned between the first insulating layer and the second insulating layer; and
a vertical alignment layer formed on the pixel electrode.

9. The liquid crystal display device of claim 1, further comprising:
a first thin film transistor and a second thin film transistor formed at each pixel,
wherein a drain electrode of the first thin film transistor is electrically connected to the first pixel electrode through a second contact hole and the drain electrode of the second thin film transistor is electrically connected to the second pixel electrode through a third contact hole.

10. The liquid crystal display device of claim 9, further comprising:
a first common voltage line and a second common voltage line,
wherein a source electrode of one of the first thin film transistor and the second thin film transistor is alternately connected to the first common voltage line or the second common voltage line through a fourth contact hole for each pixel.

11. The liquid crystal display device of claim 10, wherein the fourth contact hole is located between the second contact hole and third contact hole.

12. The liquid crystal display device of claim 1, wherein the second pixel electrode crosses the connection bridge at least one part and includes at least one protrusion part extending at the crossing part in an extension direction of the connection bridge.

13. The liquid crystal display device of claim 12, wherein a majority portion of the protrusion part is wider than the connection bridge.

14. A method of manufacturing a liquid crystal display device, comprising:
forming a connection bridge including at least one conductive layer on a first insulating substrate;
forming an insulating layer having a first contact hole and a second contact hole on the connection bridge and the first insulating substrate; and
forming a pixel electrode including a first pixel electrode, including a first part and a second part which are physically separated, and a second pixel electrode physically separated from the first pixel electrode, on the insulating layer,
wherein the first part and the second part are electrically connected to the connection bridge through the first contact hole and the second contact hole.

15. The method of claim 14, wherein the second pixel electrode is physically one body.

16. The method of claim 14, further comprising:
forming a data line including a first data line and a second data line;
wherein the first part is capacitively coupled to the first data line and the second part is capacitively coupled to the second data line and the second pixel electrode is capacitively coupled to both the first data line and the second data line.

17. The method of claim 16, wherein a capacitance between the first pixel electrode and the first data line is substantially the same as a capacitance between the second pixel electrode and the first data line, and a capacitance between the first pixel electrode and the second data line is substantially the same as a capacitance between the second pixel electrode and the second data line.

18. The method of claim 16, wherein forming the connection bridge and forming the data line are simultaneously performed.

19. The method of claim 16, further comprising:
forming another insulating layer between the data line and the pixel electrode.

* * * * *